(12) United States Patent
Hsieh et al.

(10) Patent No.: US 7,113,016 B2
(45) Date of Patent: Sep. 26, 2006

(54) DEVICE FOR DC OFFSET CANCELLATION

(75) Inventors: Yong-Hsiang Hsieh, Taoyuan (TW); Wen-Kai Li, Taipei (TW); David Jan-Chia Chen, Taipei (TW)

(73) Assignee: MuChip Co., Ltd, Hsinchu (TW)

( * ) Notice: Subject to any disclaimer, the term of this patent is extended or adjusted under 35 U.S.C. 154(b) by 0 days.

(21) Appl. No.: 11/010,996

(22) Filed: Dec. 11, 2004

(65) Prior Publication Data

US 2006/0125543 A1 Jun. 15, 2006

(51) Int. Cl.
*H03L 5/00* (2006.01)
(52) U.S. Cl. .................. 327/307; 327/67; 330/259
(58) Field of Classification Search .................. 327/67, 327/307; 330/259; 455/250.1
See application file for complete search history.

(56) References Cited

U.S. PATENT DOCUMENTS

| 6,690,225 B1* | 2/2004 | Kondo et al. ............... 327/307 |
| 6,704,560 B1* | 3/2004 | Balteanu et al. ............ 455/333 |
| 6,784,698 B1* | 8/2004 | Brenden ...................... 327/51 |
| 6,992,526 B1* | 1/2006 | Cheng ............................ 330/9 |
| 2002/0163384 A1* | 11/2002 | Hasegawa ................... 330/258 |
| 2004/0207470 A1* | 10/2004 | Van Zanten ................ 330/258 |

* cited by examiner

*Primary Examiner*—Terry D. Cunningham
*Assistant Examiner*—Thomas J. Hiltunen

(57) ABSTRACT

A DC offset cancellation device is provided, including a baseband circuit, a common mode feedback (CMFB) circuit, a low-pass filter (LPF), and an amplifier. The CMFB circuit is used to set a specific common mode DC voltage in a differential circuit; thus, the CMFB circuit can be used for detecting the common mode voltage of a differential circuit, and force the voltage to a specific value by using a feedback control. Because the size of a typical CMFB circuit is much smaller than the size of an LPF, the final size of the one-LPF device is smaller than the conventional design using two LPFs.

4 Claims, 5 Drawing Sheets

DEVICE FOR DC OFFSET CANCELLATION

FIELD OF THE INVENTION

The present invention generally relates to a device for DC offset cancellation, and more specifically to a device for DC offset cancellation by using less number of low pass filter (LPF).

BACKGROUND OF THE INVENTION

DC offset, which is often created at the amplification stage, is an undesired component in the analog and RF implementation of wireless communication. A DC offset can either corrupt the signals or saturate the following stage. The DC offset is particularly large after a down-conversion mixer as the down-conversion method translates the radio signal directly to baseband, in which the majority of the gain and filtering are performed in a frequency band from DC to the signal bandwidth. The DC offset in the signal path is amplified throughout the process and the amplified DC offset can further degrade the dynamic range of the circuit. In addition, the DC offset is created when some of the on-channel local oscillator (LO) signal leaks to input port of the mixer and is down-converted. The LO self-mixing effect caused by the LO signal leakage will further aggravate the DC offset problem. If the DC offset is not properly suppressed or cancelled, the sensitivity of the receiver using the down-conversion mixer will suffer greatly.

Various DC offset cancellation schemes have been developed to overcome this problem in the recent years. For examples, the AC-coupling method can be used to solve the problem for applications in which no useful information content in included in the DC signal. However, the large RC area occupation and the long settling time of the AC-coupling method will add an extra problem in the low-cost and high data rate transceiver circuits.

Another DC offset cancellation approach is to use a high-gain differential amplifier and a negative-feedback method. As shown in FIG. 1, a high-gain differential amplifier 108 is used to detect the output DC offset of a circuit 102, and a negative-feedback loop is used to force the DC offset down, or cancel the DC offset entirely This approach, commonly used in many design, uses two low-pass filters (LPF) 104, 106 to realize the differential DC feedback. Without the two LPFs, the AC signal will also be detected and cancelled by the feedback loop that cancels the DC offset. The conventional way to implement the low-pass filters 104, 106 can be either on-chip or off-chip. The former is problematic due to the high RC value, which results in occupying a large chip area, while the latter requires the consumption of two chip pins. It is, therefore, necessary to develop a new approach for reducing the use of the LPF.

SUMMARY OF THE INVENTION

The present invention has been made to overcome the aforementioned drawback of conventional negative-feedback loop requiring two LPFs. The primary object of the present invention is to provide a device for DC offset cancellation that reduces the use of the LPF in order to reduce to chip size. By using a common mode feedback (CMFB) circuit to detect a common mode voltage of a differential circuit, the present invention is able to provide a DC offset cancellation device using only one LPF.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

The present invention can be understood in more detail by reading the subsequent detailed description in conjunction with the examples and references made to the accompanying drawings, wherein:

FIG. 3 shows a block diagram of a third embodiment of a DC offset device according to the present invention.

DETAILED DESCRIPTION OF THE PREFERRED EMBODIMENTS

Figure 1:
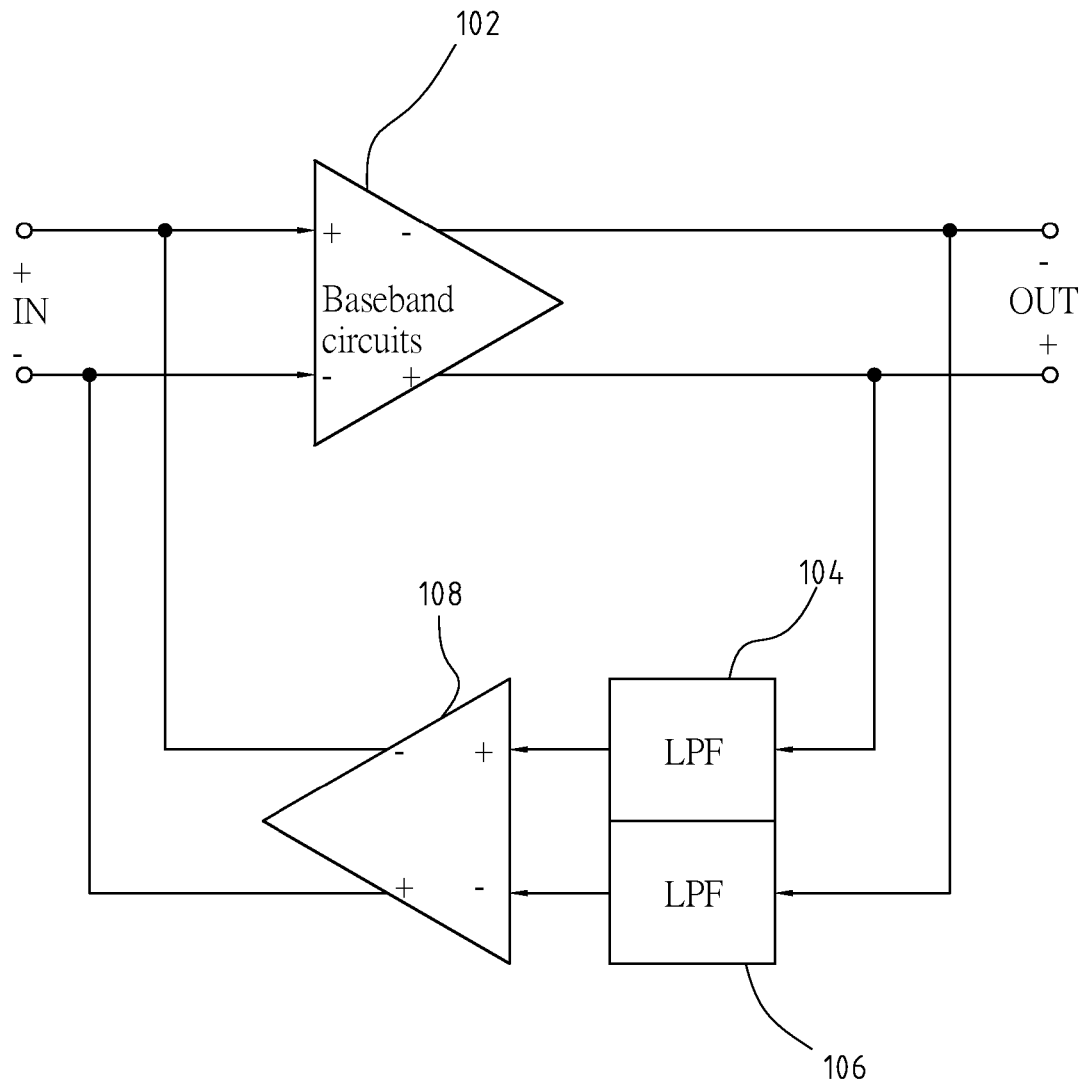
FIG. 1 shows a block diagram of a conventional DC offset cancellation circuit.
Figure 2:
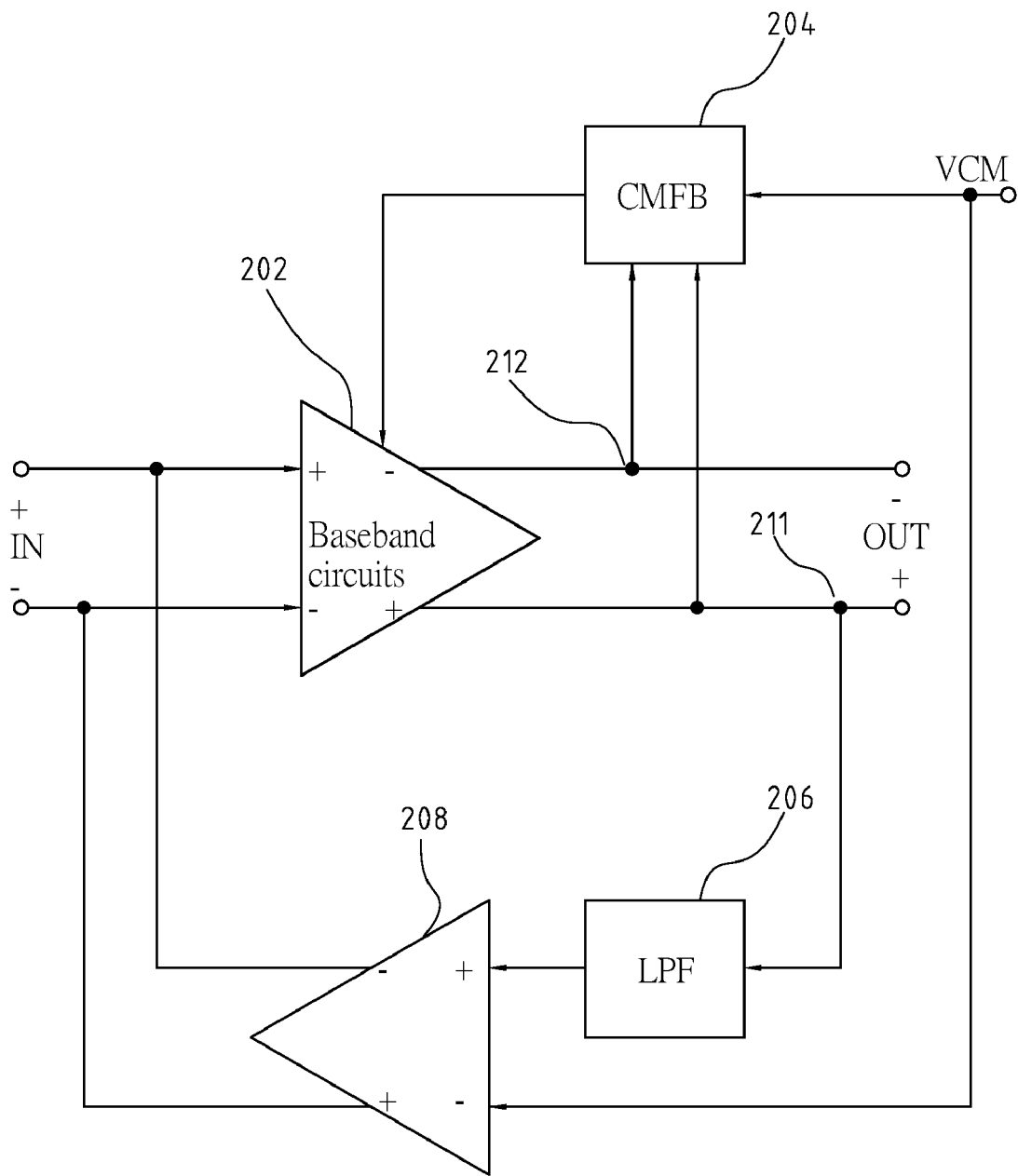
FIG. 2 shows a block diagram of a first embodiment of a DC offset device according to the present invention.

FIG. 2 shows a block diagram of a first embodiment of a DC offset cancellation device in accordance with the present invention. As shown in FIG. 2, the DC offset cancellation device includes a baseband circuit 202 having a positive input port, a negative input port, a positive output port and a negative output port; a common mode feedback (CMFB) circuit 204 having the positive and negative output ports of baseband circuit 202 and a common mode voltage ($V_{CM}$) as inputs, and outputs to baseband circuit 202; a low-pass filter (LPF) 206 having an input connected to the positive output port of baseband circuit 202 and an output; and an amplifier 208 having a positive input port connected to the output from LPF 206, a negative input port connected to $V_{CM}$, a negative output port connected to the positive input port of baseband 202 and a positive output port connected to the input negative port of baseband circuit 202. CMFB circuit 204 is used to set a specific common mode DC voltage in a differential circuit; thus, CMFB circuit 204 can be used for detecting the common mode voltage of a differential circuit, and force the voltage to a specific value by using a feedback control. Because the size of a typical CMFB circuit is much smaller than the size of an LPF, the final size of the device shown in FIG. 2 is smaller than the conventional design as shown in FIG. 1.

According to this embodiment, CMFB 204 will make the output common voltage of baseband circuit 202, which is the average of voltages at nodes 212 and 211 (i.e., $(V_{212}+V_{211})/2$), become $V_{CM}$. The DC component voltage at the node 211 is extracted by LPF 206 and compared with $V_{CM}$ by amplifier 208. Amplifier 208, forming a negative feedback loop between the input ports and the output ports baseband circuit 202, fill force the voltage of node 211 to become $V_{CM}$. Because both the common DC voltage and absolute DC voltage of node 211 are equal to $V_{CM}$, the absolute DC voltage of node 212, which is $2*V_{CM}-V_{211}$, will be $V_{CM}$. With this connection, it is easy to achieve the output common mode voltage setting and DC offset cancellation at the same time.

It is worth noticing that the single LPF can be realized by either on-chip or off-chip component. If it is on-chip, the occupied area will be smaller than that of the conventional two-LPF design. On the other hand, if it is off-chip, only one pin is required for connection.

It should be understood that the voltage errors in CMFB 204 and feedback amplifier 208 may further introduce an DC offset. Those errors are results from device mismatch and finite gain of amplifiers in CMFB 204 and the DC offset cancellation loop. If the error voltage of CMFB 204 is $Ve_{CMFB}$ and the error voltage of amplifier 208 is $Ve_{AMP}$, the total DC offset of this embodiment can be expressed as:

$$(V_{211}+V_{212})/2 = V_{CM} + Ve_{CMFB}; V_{211} + Ve_{AMP} = V_{CM}, \text{ and}$$

$$DC_{offset} = V_{212} - V_{211} = 2Ve_{CMFB} + 2Ve_{AMP}$$

Thus, it is important to maximize the loop gain and minimize the device mismatch to achieve the smallest intrinsic DC offset error.

Figure 3:
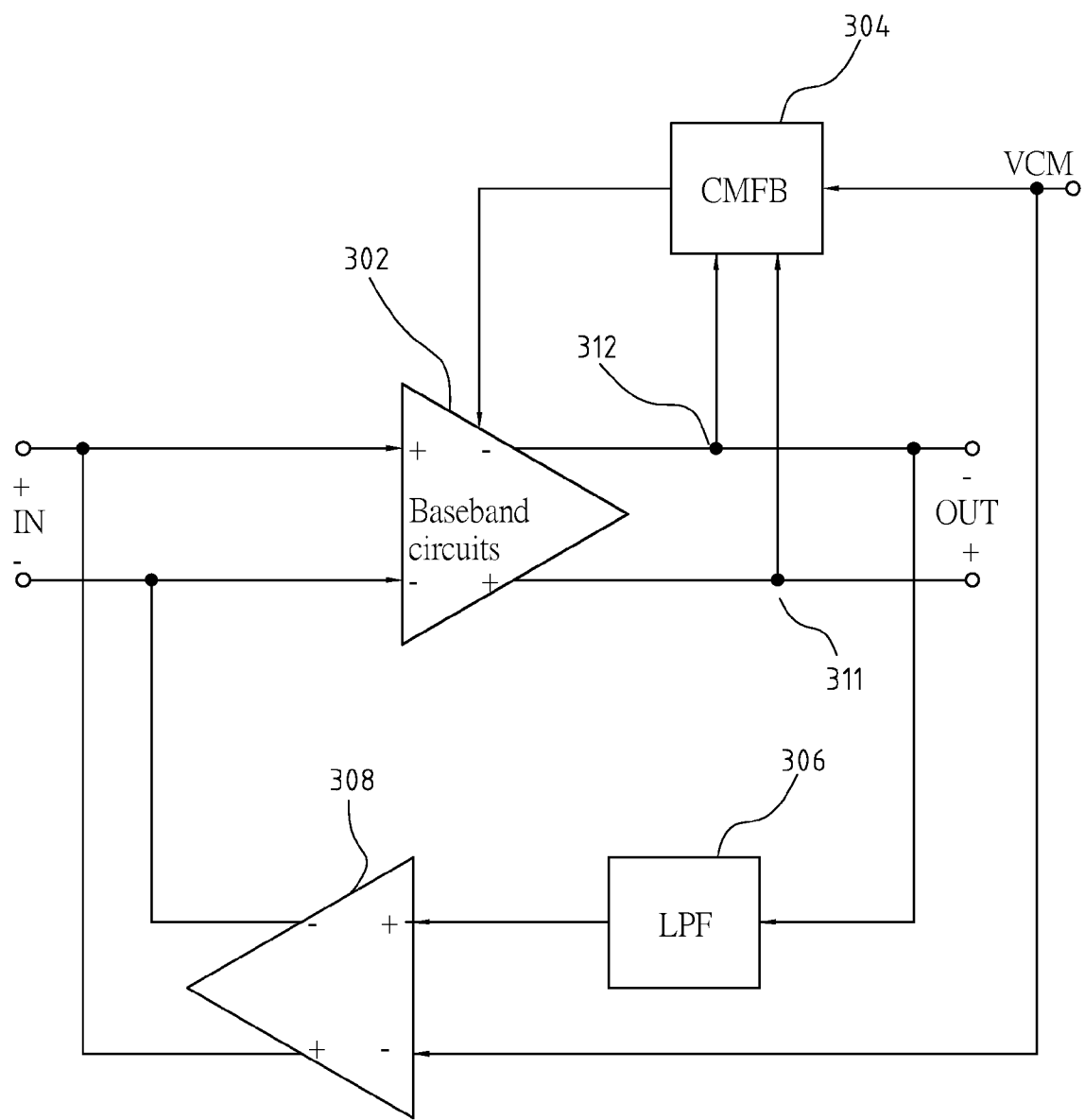
FIG. 3 shows a block diagram of a second embodiment of a DC offset device according to the present invention.

FIG. 3 shows a second embodiment of a DC offset cancellation device of the present invention. This embodiment is similar to the embodiment shown in FIG. 2, except that LPF 306 is placed between the negative output port of baseband circuit 302 and the positive input port of amplifier 308. In addition, the negative output port of amplifier 308 is connected to the negative input port of baseband circuit 302, and the positive output port of amplifier 308 is connected to the positive input port of baseband circuit 302.

Figure 4:
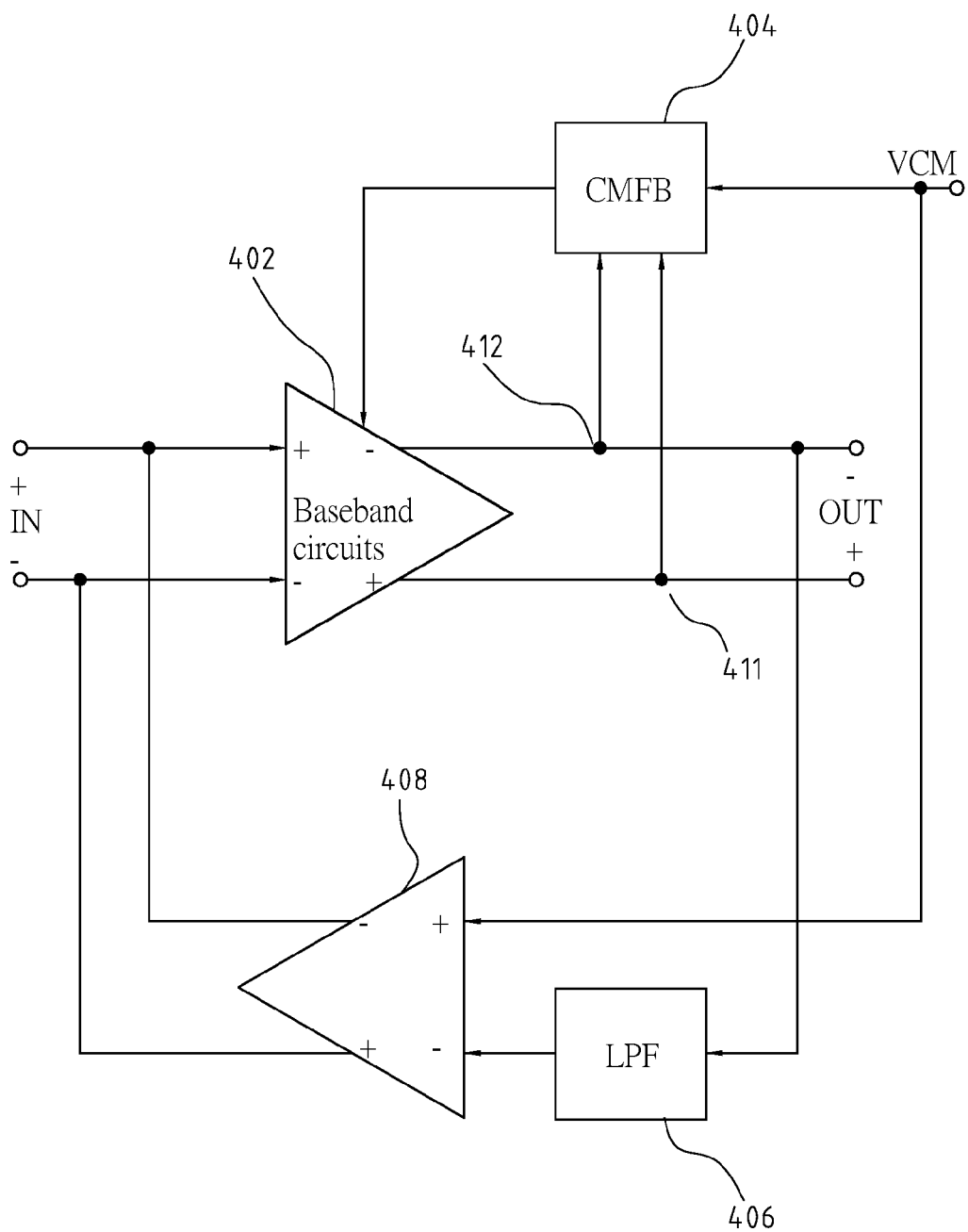
FIG. 4 shows a block diagram of a fourth embodiment of a DC offset device according to the present invention.

FIG. 4 shows a third embodiment of a DC offset cancellation device of the present invention. This embodiment is similar to the embodiment shown in FIG. 2, except that LPF 406 is placed between the negative output port of baseband circuit 402 and the negative input port of amplifier 408. In addition, the positive input port of amplifier 408 is connected to $V_{CM}$.

Figure 5:
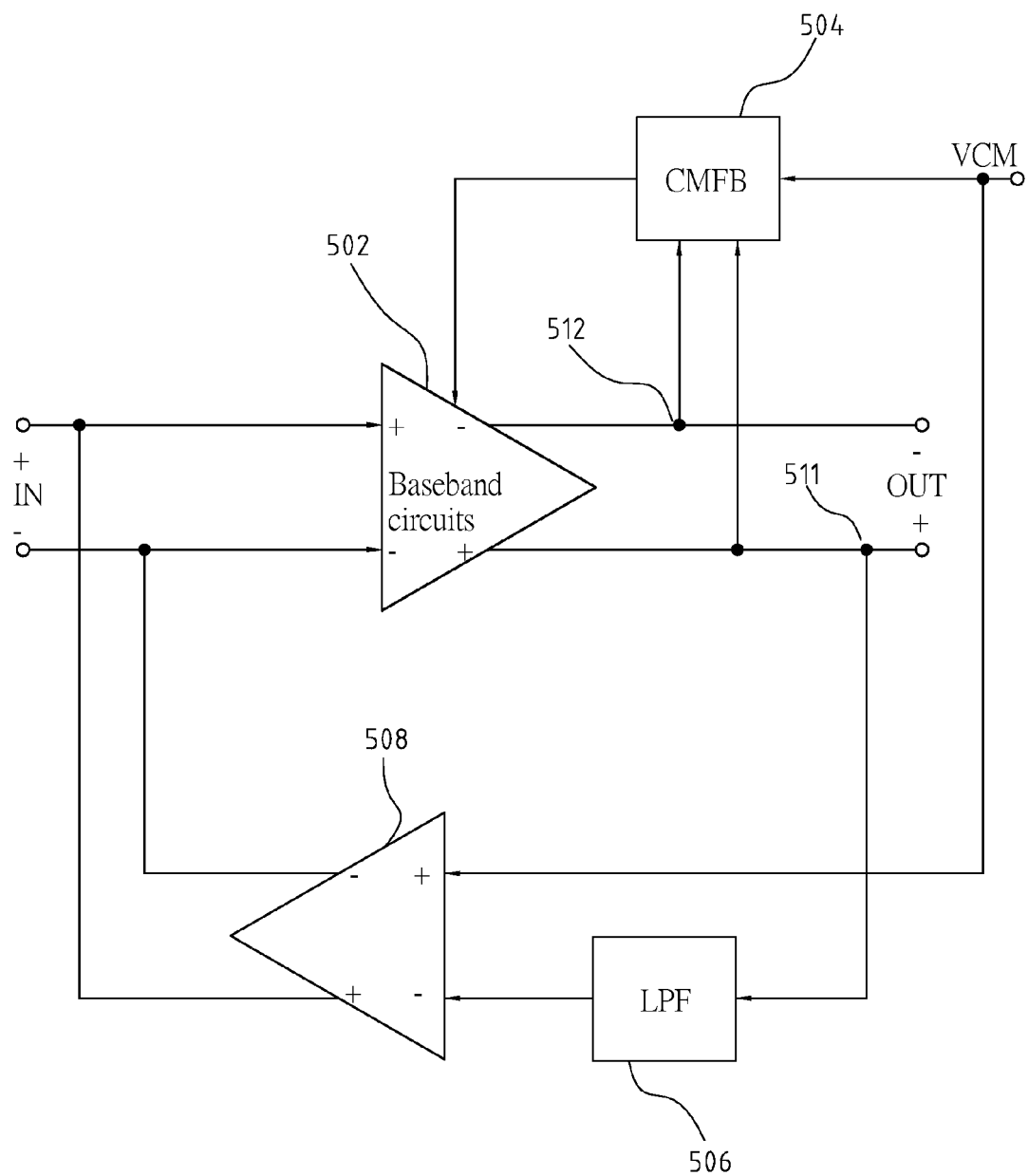
FIG. 5 shows a block diagram of a fifth embodiment of a DC offset device according to the present invention

FIG. 5 shows a fourth embodiment of a DC offset cancellation device of the present invention. This embodiment is similar to the embodiment shown in FIG. 2, except that LPF 506 is placed between the positive output port of baseband circuit 502 and the negative input port of amplifier 508. In addition, the positive input port of amplifier 508 is connected to $V_{CM}$, the negative output port of amplifier 508 is connected to the negative input port of baseband circuit 502, and the positive output port of amplifier 508 is connected to the positive input port of baseband circuit 502.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A device for DC offset cancellation, comprising:
a baseband circuit, having a positive input port, a negative input port, a positive output port and a negative output port;
a common mode feedback (CMFB) circuit, having said positive and negative output ports of said baseband circuit and a common mode voltage ($V_{CM}$) as inputs, and an output connected to said baseband circuit;
a low-pass filter (LPF), having an input connected to said positive output port of said baseband circuit and an output; and
an amplifier, having a positive input port connected to said output of said LPF, a negative input port connected to said $V_{CM}$, a negative output port connected to said positive input port of said baseband and a positive output port connected to said input negative port of said baseband circuit.

2. A device for DC offset cancellation, comprising:
a baseband circuit, having a positive input port, a negative input port, a positive output port and a negative output port;
a common mode feedback (CMFB) circuit, having said positive and negative output ports of said baseband circuit and a common mode voltage ($V_{CM}$) as inputs, and an output connected to said baseband circuit;
a low-pass filter (LPF), having an input connected to said negative output port of said baseband circuit and an output;
an amplifier, having a positive input port connected to said output port of said LPF, a negative input port connected to said $V_{CM}$, a negative output port connected to said negative input port of said baseband circuit, and a positive output port connected to said positive input port of said baseband circuit.

3. A device for DC offset cancellation, comprising:
a baseband circuit, having a positive input port, a negative input port, a positive output port and a negative output port;
a common mode feedback (CMFB) circuit, having said positive and negative output ports of said baseband circuit and a common mode voltage ($V_{CM}$) as inputs, and an output connected to said baseband circuit;
a low-pass filter (LPF), having an input connected to said negative output port of said baseband circuit and an output; and
an amplifier, having a positive input port connected to said $V_{CM}$, a negative input port connected to said output of said LPF, a negative output port connected to said positive input port of said baseband and a positive output port connected to said input negative port of said baseband circuit.

4. A device for DC offset cancellation, comprising:
a baseband circuit, having a positive input port, a negative input port, a positive output port and a negative output port;
a common mode feedback (CMFB) circuit, having said positive and negative output ports of said baseband circuit and a common mode voltage ($V_{CM}$) as inputs, and an output connected to said baseband circuit;
a low-pass filter (LPF), having an input connected to said positive output port of said baseband circuit and an output; and
an amplifier, having a positive input port connected to said $V_{CM}$, a negative input port connected to said output port of said LPF, a negative output port connected to said negative input port of said baseband circuit, and a positive output port connected to said positive input port of said baseband circuit.

* * * * *